(12) United States Patent
Miwa et al.

(10) Patent No.: US 7,442,064 B2
(45) Date of Patent: Oct. 28, 2008

(54) BOARD CONNECTING BODY

(75) Inventors: Takeya Miwa, Makinohara (JP); Tadashi Hasegawa, Shizuoka (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 11/979,291

(22) Filed: Nov. 1, 2007

(65) Prior Publication Data

US 2008/0108240 A1 May 8, 2008

(30) Foreign Application Priority Data

Nov. 2, 2006 (JP) ............................. 2006-299236

(51) Int. Cl.
*H01R 13/62* (2006.01)

(52) U.S. Cl. ....................... 439/326; 439/341

(58) Field of Classification Search .................. 439/326, 439/376, 341, 74

See application file for complete search history.

(56) References Cited

FOREIGN PATENT DOCUMENTS

JP          2003-009347          1/2003

*Primary Examiner*—Tulsidas C. Patel
*Assistant Examiner*—Harshad C Patel
(74) *Attorney, Agent, or Firm*—Edwards Angell Palmer & Dodge LLP

(57) ABSTRACT

The board connecting body includes: a pair of board cases electrically connected to each other when connectors each attached to a printed circuit board received in a housing of the board cases are fitted to each other; a receiving wall part of the housing of one board case capable of receiving the housing of another board case; a projection formed on one of the receiving wall part and the housing of the other board case; and a groove formed on the other of the receiving wall part and the housing of the other board case, the projection being capable of entering the groove, wherein the groove includes: a straight part extending along a fitting direction of the connectors; and a receiving part formed in such a manner that a width of the receiving part gradually decreases from an outer edge to the straight part.

1 Claim, 6 Drawing Sheets

US 7,442,064 B2

BOARD CONNECTING BODY

BACKGROUND OF THE INVENTION (1) Field of the Invention

The present invention relates to a board connecting body, in which board cases each receiving a printed circuit board in a housing of the board case are electrically connected to each other by connectors attached to the respective printed circuit boards.

(2) Description of the Related Art

As the board connecting body described above, an electric junction box (or a junction block) to be mounted on a motor vehicle is known. For example, as disclosed in Japanese Patent Application Laid-Open No. 2003-9347, the electric junction box includes: a first board case which receives a printed circuit board mounting a plurality of electronic components such as a fuse and relay in a housing of the first board case; and a second board case which receives a printed circuit board forming a circuit to be connected to a plurality of the electronic components in a housing of the second board case.

The first and second board cases are electrically connected to each other when connectors attached to the respective printed circuit boards are fitted to each other. The housings are provided with respective locking parts capable of engaging with each other. The first and second board cases are fixed to each other when the locking parts engage with each other.

When the first and second board cases are placed one upon another, the connectors are fitted to each other. When the locking parts of the respective board cases engage with each other, the connectors are regarded to be fitted to each other.

However, with the junction box described above, it is not possible to confirm a condition of the fitting between the connectors with eyes from the outside because the housings of the board cases conceal the inside. Therefore, it is difficult to correctly check whether or not there is failure in assembly of the connectors. Moreover, since the board cases are assembled with each other on a condition that a connecting part of the connectors, i.e. a connecting part of the board cases cannot be seen, therefore there is possibly a problem that the connectors hit each other causing a deformation or damage thereof and failure in assembly of the connectors due to the assembly on a condition of the deformation of the connectors.

SUMMARY OF THE INVENTION

It is therefore an objective of the present invention to solve the above problems and to provide a board connecting body, by which the board cases can be securely electrically connected to each other without failure in assembly even if the connecting part between the board cases cannot be seen.

In order to attain the above objective, the present invention is to provide a board connecting body including:

a pair of board cases;

a housing of the board case;

a printed circuit board received in the housing;

a connector attached to the printed circuit board; and a locking part formed on the housing, wherein the pair of board cases are electrically connected to each other when connectors are fitted to each other, and the pair of the board cases are fixed to each other when the locking parts engage with each other, the board connecting body further including:

a receiving wall part formed on the housing of one board case of the pair of the board cases, said receiving wall part being formed capable of receiving the housing of another board case of the pair of the board cases;

a projection formed on one of the receiving wall part and the housing of the other board case, said projection projecting toward another of the receiving wall part and the housing of the other board case; and a groove formed on the other of the receiving wall part and the housing of the other board case, said projection being capable of entering said groove, wherein said groove includes: a straight part extending along a fitting direction of the connectors; and a receiving part which is formed from an outer edge of the other of the receiving wall part and the housing of the other board case to the straight part, said outer edge facing the one of the receiving wall part and the housing of the other board case, the receiving part being formed in such a manner that a width of the receiving part gradually decreases from said outer edge to the straight part.

With the construction described above, the board cases can be easily positioned relatively to each other at a position where the connectors face each other, and the board cases can be allowed to approach each other straight along the fitting direction of the connectors. Therefore, the connectors are straight fitted to each other without being inclined to each other. Therefore, even if the fitting condition between the connectors cannot be seen, the board connecting body can be provided, by which the failure in combining the board cases with each other can be prevented from occurring, that is, the board cases can be securely connected electrically to each other.

DESCRIPTION OF THE PREFERRED EMBODIMENTS

Figure 1:
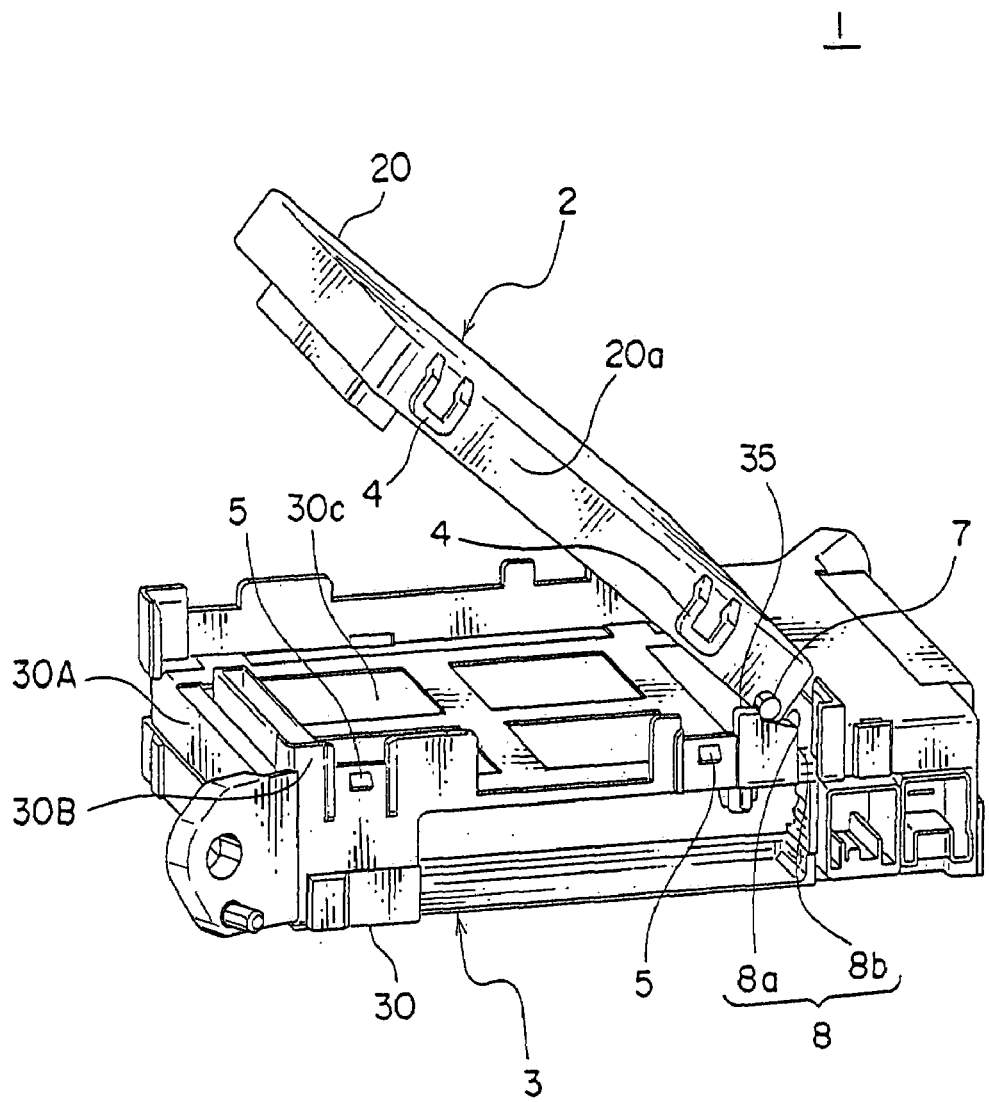
FIG. 1 is a perspective view of an junction box according to a preferred embodiment of the present invention, illustrating a state when the projection formed on the first board case is positioned within the receiving part formed on the second board case.

In the following, a board connecting body according to a preferred embodiment of the present invention will be explained with reference to FIGS. 1-6. An electric junction box 1 according to the preferred embodiment of the present invention is mounted on a motor vehicle as a mobile body. The electric junction box 1 includes a first board case 2 and a second board case 3 to be combined with the first board case 2.

The first board case 2 includes a housing 20 made of electrically insulating synthetic resin and a printed circuit board 21. The housing 20 has a flat plate-shape and includes a space for receiving the printed circuit board 21 therein. The printed circuit board 21 is a known printed circuit board, on which a CPU for controlling a relay and fuse to be mounted on a printed circuit board 31 (explained later) is mounted, said printed circuit board 31 being received in the second board case 3. The printed circuit board 21 is received in the housing 20 of the first board case 2 and fixed to the housing 20 by a screw or the like.

The printed circuit board 21 includes a connector 24 for connection to the printed circuit board 31 (explained later). The connector 24 includes: a connector housing 23 made of synthetic resin rising up from the printed circuit board 21 toward the second board case 3-side; and a female terminal fitting 22 to be received in the connector housing 23. The terminal fitting 22 is formed by bending an electrically conductive sheet metal. One end part of the terminal fitting 22 is stabbed into the printed circuit board 21 so as to be connected to a circuit pattern of the printed circuit board 21, while an opposite end part of the terminal fitting 22 is formed in a tube-shape so as to be capable of receiving a terminal fitting 32 (explained later) therein.

The second board case 3 includes a housing 30 made of electrically insulating synthetic resin and a printed circuit board 31. The housing 30 has a flat plate-shape and includes: a board-receiving part 30A having a space for receiving the printed circuit board 31 therein; and a receiving wall part 30B. The housing 20 is placed on the housing 30 in such a manner that the printed circuit board 21 is arranged in parallel with the printed circuit board 31. The printed circuit board 31 is a known printed circuit board, on which a relay and fuse is mounted. The printed circuit board 31 is received in the board-receiving part 30A and fixed to the board-receiving part 30A by a screw or the like.

The printed circuit board 31 includes a connector 34 for connection to the printed circuit board 21. The connector 34 includes: a connector housing 33 made of synthetic resin rising up from the printed circuit board 31 toward the first board case 2-side; and a male terminal fitting 32 to be received in the connector housing 33. The terminal fitting 32 is formed by bending an electrically conductive metal formed in a bar-shaped. One end part of the terminal fitting 32 is stabbed into the printed circuit board 31 so as to be connected to a circuit pattern of the printed circuit board 31, while an opposite end part of the terminal fitting 32 is received in and fitted to the terminal fitting 22.

The receiving wall part 30B is composed of a plurality of walls rising up from an upper surface 30C of the board-receiving part 30A, on which upper surface 30C the first board case 2 is placed. The receiving wall part 30B is arranged on the same planes as those of side surfaces (i.e. four surfaces arranged in a direction crossing at right angles the upper surface 30C) of the board-receiving part 30A, rises up at least from four corners of the upper surface 30C, and is formed in a frame-shape. The receiving wall part 30B receives the housing 20 inside.

In the electric junction box 1, the first board case 2 is placed on the upper surface 30C and placed on the second board case 3 being received inside the receiving wall part 30B. The receiving wall part 30B includes a plurality of locking projections 5 as the locking parts which project outward. In the preferred embodiment, the receiving wall part 30B includes in total four locking projections 5 consisting of two locking projections 5 situated on this side in FIG. 1 and two locking projections 5 (not shown in FIG. 1) situated on the depth side in FIG. 1. The housing 20 includes mating locking parts 4 as frame-shaped locking parts, which are capable of positioning the locking projections 5 inside, on side surfaces 20a that face the receiving wall part 30B. The number of the mating locking parts 4 is the same as the number of the locking projections 5. When the locking projections 5 are positioned within the respective mating locking parts 4, that is, when the locking projections 5 engage with the respective mating locking parts 4, the first board case 2 and the second board case 3 are fixed to each other.

Further, the receiving wall part 30B is provided with in total two grooves 8 consisting of one groove 8 situated at right corner on this side in FIG. 1 and one groove 8 situated at right corner on the depth side in FIG. 1, that is, one groove 8 each at positions facing each other of the receiving wall part 30B. Furthermore, the side surfaces 20a that face the receiving wall part 30B of the housing 20 are provided with respective cylindrical projections 7 which project outward, that is, toward the receiving wall part 30B. Two projections 7 are provided at positions where the projections 7 face the respective grooves 8.

Figure 6:
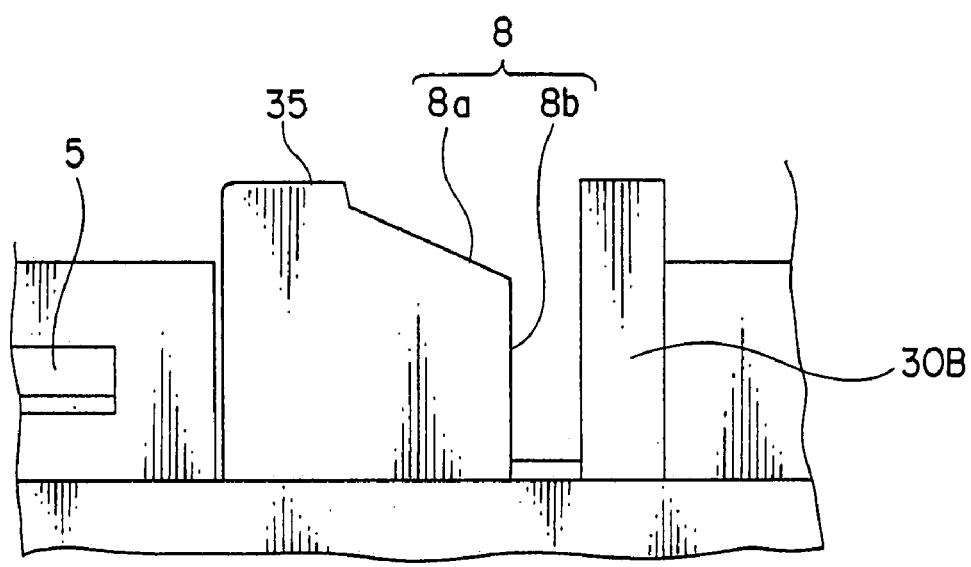
FIG. 6 is a side view illustrating the groove including the receiving part and the straight part shown in FIG. 1.

As shown in FIG. 6, the groove 8 includes: a straight part 8b formed by straight notching the receiving wall part 30B from the central part of the receiving wall part 30B along a direction in which the board cases 2 and 3 face each other (i.e. the fitting direction of the connectors 24 and 34) to an outer edge of the receiving wall part 30B near the upper surface 30C; and a receiving part 8a formed by notching the receiving wall part 30B from an outer edge part 35 (i.e. an outer edge part facing the first board case 2) of the receiving wall part 30B situated away from the upper surface 30C to the straight part 8b.

A width (in a direction crossing at right angles the fitting direction) of the straight part 8b is slightly larger than a diameter of the projection 7. A width of the receiving part 8a gradually decreases from the outer edge part 35 to the straight part 8b.

The projection 7 enters the groove 8 from the outer edge part 35 toward the straight part 8b. The projection 7 is positioned at a lower end of the straight part 8b near the upper surface 30C when the locking projections 5 and the mating locking parts 4 engage with one another.

In the following, a method of combining the first board case 2 and the second board case 3 with each other will be explained with reference to FIGS. 1-4.

Figure 2:
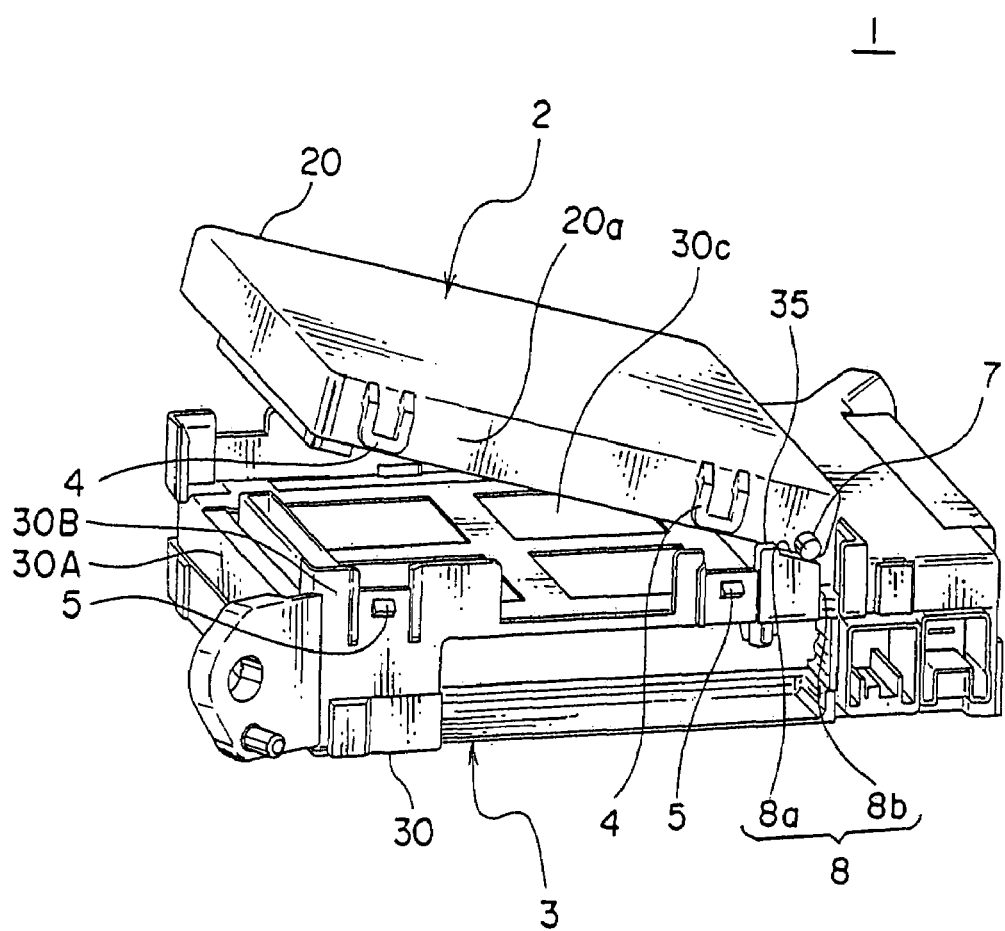
FIG. 2 is a perspective view illustrating a state when the projection shown in FIG. 1 slides on the receiving part.

First, as shown in FIG. 1, the projection 7 is inserted into the receiving part 8a on a condition that the first board case 2 is inclined with respect to the second board case 3. At that time, the projection 7 situated on this side in FIG. 1 and the projection 7 situated on the depth side (not shown in FIG. 1) are simultaneously inserted into the respective receiving parts 8a. Then, as shown in FIG. 2, the first board case 2 is moved so as to be in parallel with the second board case 3 on a condition that the projection 7 slides on an edge part of the receiving part 8a toward the straight part 8b.

Figure 3:
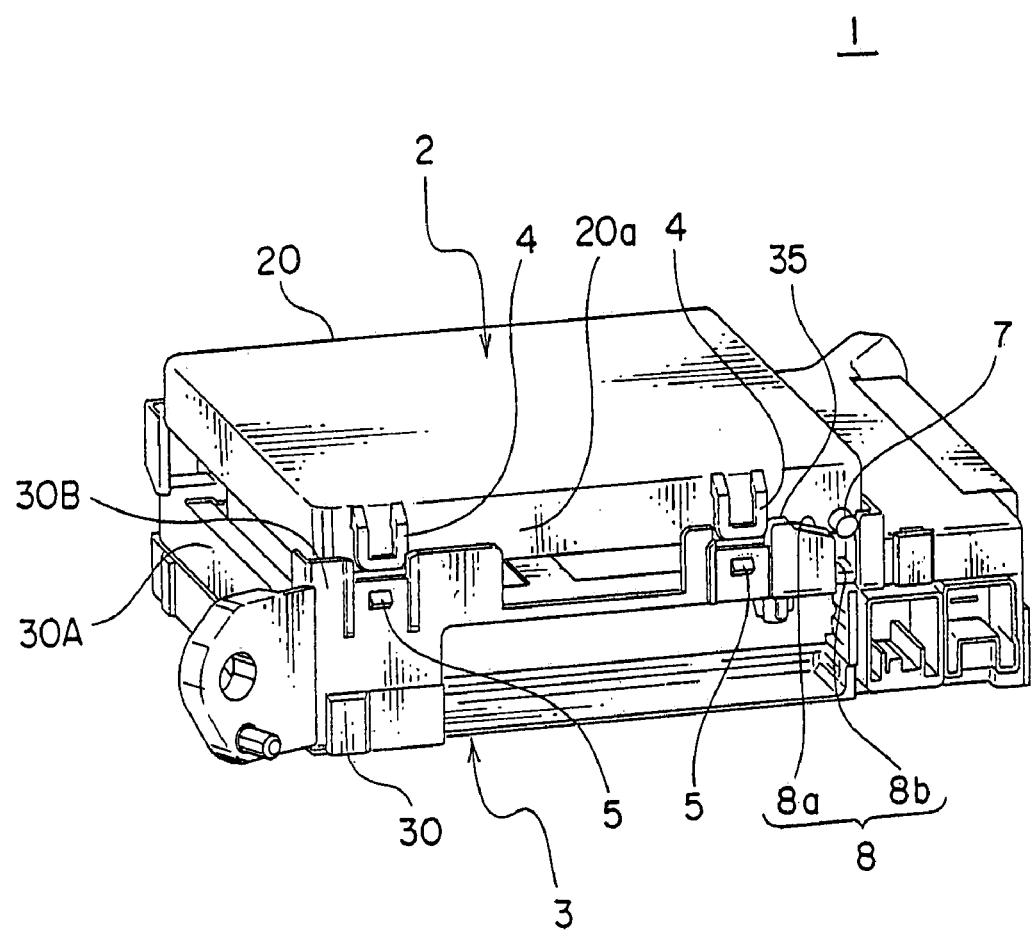
FIG. 3 is a perspective view illustrating a state when the projection shown in FIG. 2 is positioned at the straight part, and the first and second board cases facing each other in parallel along the fitting direction of the connectors.

Then, as shown in FIG. 3, when the projection 7 is positioned at an end part of the straight part 8b near the receiving part 8a, the side surface 20a near the projection 7, on which side surface 20a the projection 7 is not provided, abuts against an inner surface of the receiving wall part 30B, so that the first board case 2 and the second board case 3 are positioned in a direction in which the first board case 2 and the second board case 3 are arranged in parallel with each other (that is, in a direction in which the printed circuit boards 21 and 31 are arranged in parallel with each other). Further, on this condition, the connectors 24 and 34 are positioned at respective positions where the connectors 24 and 34 face each other.

Figure 4:
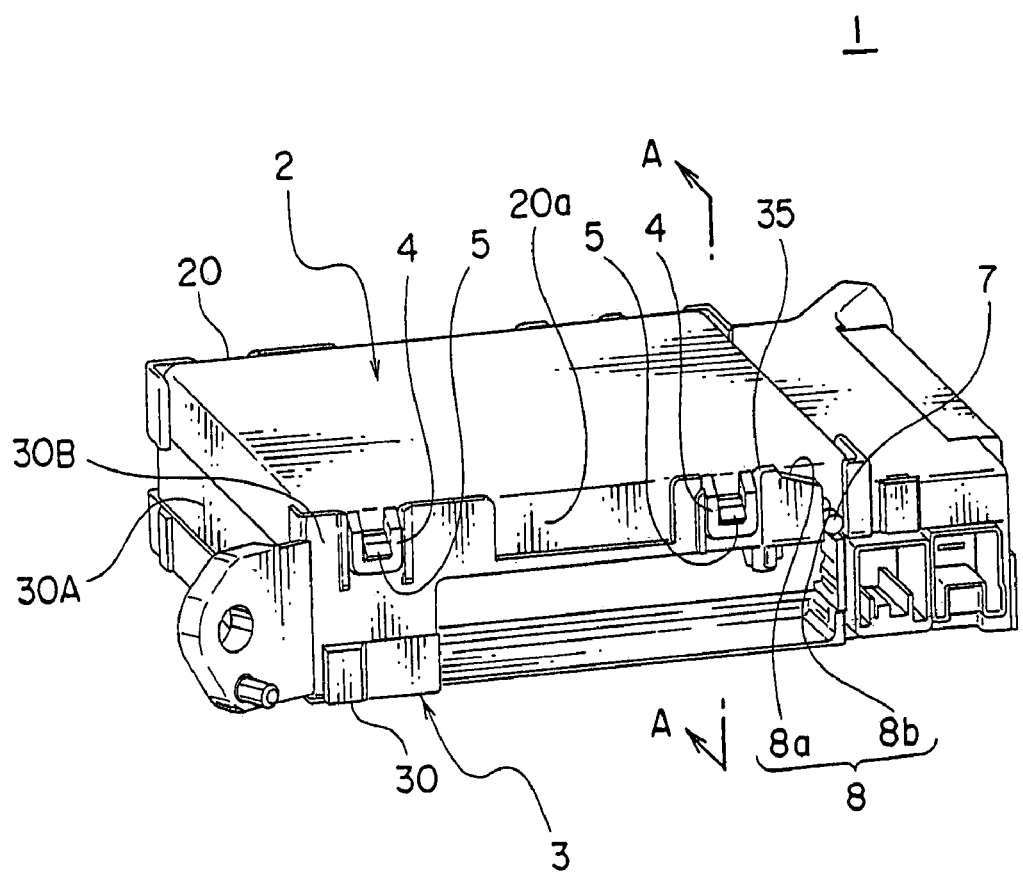
FIG. 4 is a perspective view illustrating a state when the projection shown in FIG. 3 is positioned at a lower end of the straight part, and the first and second board cases are fixed to each other.
Figure 5:
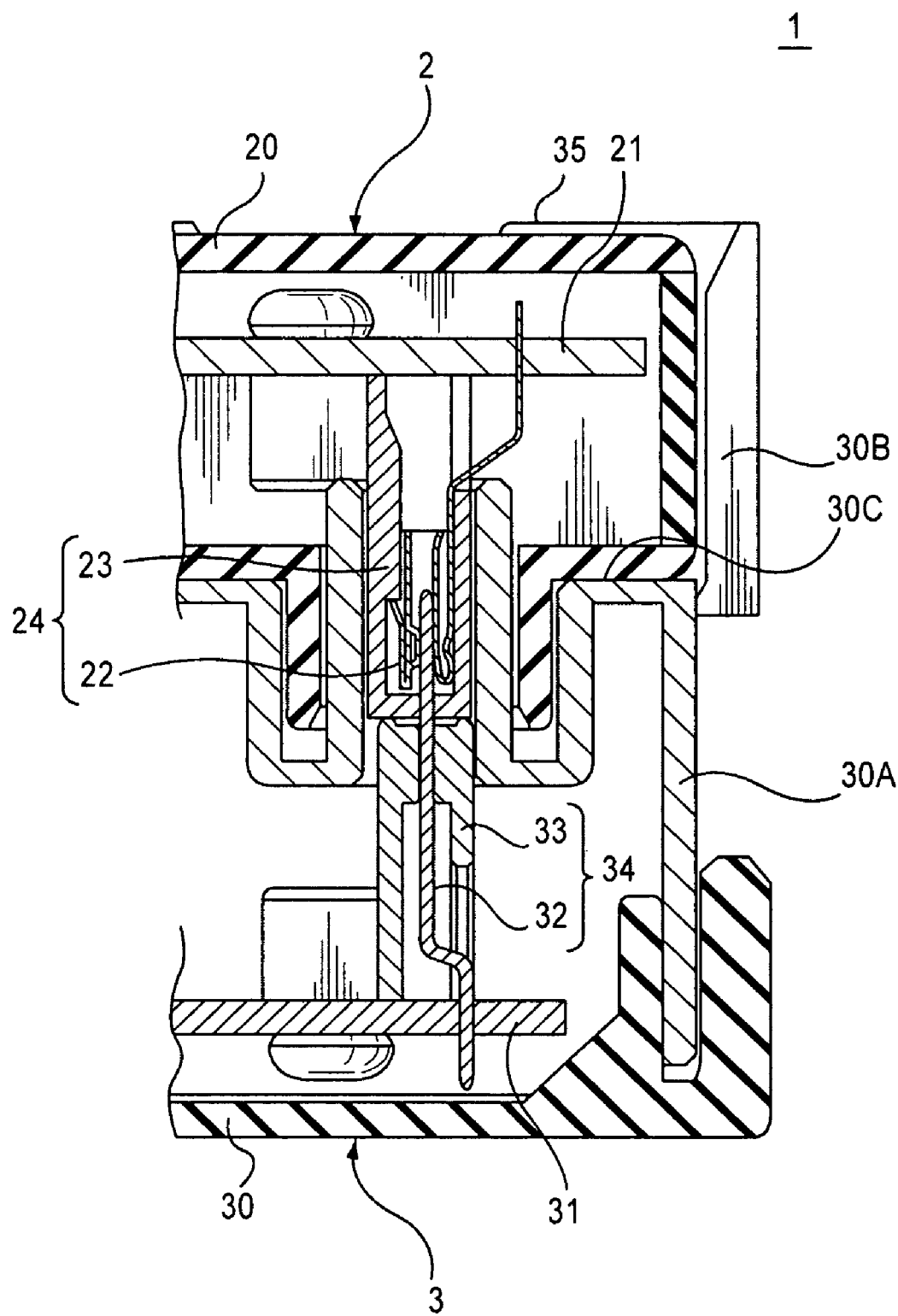
FIG. 5 is a cross sectional view taken along an A-A line in FIG. 4.

Then, the first board case 2 is moved toward the second board case 3. At that time, since the projection 7 advances within the straight part 8b toward a lower end of the straight part 8b near the upper surface 30C along the fitting direction of the connectors 24 and 34, therefore the first board case 2 approaches the second board case 3 along the fitting direction of the connectors 24 and 34 so as to be placed on the second board case 3 as shown in FIG. 4. Further, when the first board case 2 is placed on the second board case 3, simultaneously the connectors 24 and 34 are fitted to each other. Further, at the same time, the locking projection 5 and the mating locking part 4 engage with each other, so that the first board case 2 and the second board case 3 are fixed to each other.

The electric junction box 1 described above is fixed on a panel or the like which constitutes a body of a motor vehicle so as to electrically connect various electronic instruments mounted on the motor vehicle according to a predetermined pattern.

According to the preferred embodiment described above, the board cases 2 and 3 can be easily positioned at the respective positions where the connectors 24 and 34 face each other and can be allowed to approach straight each other along the fitting direction of the connectors 24 and 34. Therefore, the connectors 24 and 34 can be fitted straight to each other without being inclined with respect to each other. Therefore, even if the fitting condition between the connectors 24 and 34 cannot be seen, the electric junction box 1 can be provided, by which the failure in combining the first board case 2 and the second board case 3 with each other can be prevented from occurring, that is, the first board case 2 and the second board case 3 can be securely connected electrically to each other.

In the preferred embodiment described above, the projection 7 is provided on the housing 20 and the groove 8 is provided on the housing 30. However, instead, the projection 7 may be provided on the housing 30 and the groove 8 may be provided on the housing 20. Further, in the preferred embodiment described above, two projections 7 and two grooves 8 are provided. However, instead, at least one projection 7 may be provided and at least one groove 8 may be provided.

Furthermore, in the preferred embodiment described above, as the board connecting body, the electric junction box 1 is explained as an example. However, a board connecting body according to the present invention includes any board connecting body, in which board cases having respective printed circuit boards to which respective connectors are attached are placed one upon another so that the board cases are electrically mechanically connected to each other.

The aforementioned preferred embodiments are described to aid in understanding the present invention and variations may be made by one skilled in the art without departing from the spirit and scope of the present invention.

What is claimed is:

1. A board connecting body comprising:
    a pair of board cases, wherein each board case includes a housing;
    a printed circuit board received in the housing;
    a connector attached to the printed circuit board; and
    a locking part formed on the housing,
  wherein the pair of board cases are electrically connected to each other when connectors are fitted to each other, and the pair of the board cases are fixed to each other when the locking parts engage with each other,
    the board connecting body further comprising:
    a receiving wall part formed on the housing of one board case of the pair of the board cases, said receiving wall part being formed capable of receiving the housing of another board case of the pair of the board cases;
    a projection formed on one of the receiving wall part and the housing of the other board case, said projection projecting toward another of the receiving wall part and the housing of the other board case; and
    a groove formed on the other of the receiving wall part and the housing of the other board case, said projection being capable of entering said groove,
  wherein said groove includes: a straight part extending along a fitting direction of the connectors; and a receiving part which is formed from an outer edge of the other of the receiving wall part and the housing of the other board case to the straight part, said outer edge facing the one of the receiving wall part and the housing of the other board case, the receiving part being formed in such a manner that a width of the receiving part gradually decreases from said outer edge to the straight part.

* * * * *